United States Patent
Shimada et al.

(10) Patent No.: US 7,271,579 B2
(45) Date of Patent: Sep. 18, 2007

(54) AC SIGNAL LEVEL DETECTION CIRCUIT (75) Inventors: Masaaki Shimada, Saitama (JP); Tomoyasu Yamada, Saitama (JP); Keiichi Sekiguchi, Saitama (JP)

(73) Assignee: Sanken Electric Co., Ltd. (JP)

( * ) Notice: Subject to any disclaimer, the term of this patent is extended or adjusted under 35 U.S.C. 154(b) by 239 days.

(21) Appl. No.: 10/506,641

(22) PCT Filed: Mar. 6, 2003

(86) PCT No.: PCT/JP03/02651

§ 371 (c)(1), (2), (4) Date: Sep. 3, 2004

(87) PCT Pub. No.: WO03/075019

PCT Pub. Date: Sep. 12, 2003

(65) Prior Publication Data
US 2005/0151567 A1   Jul. 14, 2005

(30) Foreign Application Priority Data
Mar. 6, 2002   (JP) .............................. 2002-060059

(51) Int. Cl.
G01R 19/22   (2006.01)
(52) U.S. Cl. ...................................... 324/119; 324/111
(58) Field of Classification Search ..................... None
See application file for complete search history.

(56) References Cited

U.S. PATENT DOCUMENTS

| | | | | |
|---|---|---|---|---|
| 3,385,978 A * | 5/1968 | Willard | ......................... | 327/76 |
| 3,641,546 A * | 2/1972 | Blackburn | .................. | 340/661 |
| 3,659,209 A * | 4/1972 | Puckette | ...................... | 327/15 |
| 3,725,795 A * | 4/1973 | Mesenhimer | ................ | 327/74 |
| 3,800,198 A * | 3/1974 | Graf et al. | ................... | 318/806 |
| 3,895,237 A * | 7/1975 | Harr | ............................ | 327/62 |
| 4,011,507 A * | 3/1977 | Rossell | ....................... | 324/127 |
| 4,031,463 A * | 6/1977 | Norberg | .................. | 324/76.16 |
| 4,031,464 A * | 6/1977 | Norberg | .................. | 324/76.74 |
| 4,119,797 A * | 10/1978 | Wollert | ....................... | 381/110 |
| 4,402,029 A * | 8/1983 | Fujita | ........................... | 361/90 |
| 4,541,029 A * | 9/1985 | Ohyama | ...................... | 361/31 |

(Continued)

FOREIGN PATENT DOCUMENTS

JP   50-122285   9/1975

(Continued)

Primary Examiner—Ernest Karlsen
(74) Attorney, Agent, or Firm—Townsend and Townsend and Crew (57) ABSTRACT An AC voltage generated by an AC power source 1 is rectified by a full-wave rectifying circuit 2, which generates a rectified voltage. An internal regulator 33 performs waveform shaping of the rectified voltage. A comparator 42 compares the rectified voltage output from the internal regulator 33 with a reference voltage V1 and detects a period in which the rectified voltage exceeds the reference voltage V1. According to an output signal of the comparator 42, a determination signal generation circuit 50 determines the power source voltage supplied form the AC power source 1 and generates a determination signal. Accordingly, there is no need of a capacitor, etc. for detecting the peak value of the rectified voltage, and it is possible to reduce the size and cost of an AC voltage detection circuit.

8 Claims, 10 Drawing Sheets

U.S. PATENT DOCUMENTS

| | | | | |
|---|---|---|---|---|
| 4,787,022 A * | 11/1988 | Maeba et al. | ................. | 363/52 |
| 4,823,227 A * | 4/1989 | Grant | ......................... | 361/90 |
| 4,992,722 A * | 2/1991 | Maruyama et al. | ........... | 322/33 |
| 4,999,730 A * | 3/1991 | Pickard | ....................... | 361/59 |
| 5,006,975 A * | 4/1991 | Neufeld | ....................... | 363/80 |
| 5,097,147 A * | 3/1992 | Stuebing et al. | ............... | 327/74 |
| 5,319,514 A * | 6/1994 | Walsh et al. | .................. | 361/59 |
| 5,367,424 A * | 11/1994 | Even | .......................... | 361/18 |
| 5,406,468 A * | 4/1995 | Booth | ........................ | 363/15 |
| 5,436,580 A * | 7/1995 | Kellmann et al. | ............ | 327/24 |
| 5,555,483 A * | 9/1996 | Pressman et al. | ............. | 361/90 |
| 5,757,275 A * | 5/1998 | Mowry, Jr. | ................. | 340/664 |
| 5,761,057 A * | 6/1998 | Muchenberger | .......... | 363/21.01 |
| 5,856,751 A * | 1/1999 | Gleim et al. | .................. | 327/74 |
| 5,859,756 A * | 1/1999 | Pressman et al. | ............. | 361/90 |
| 5,903,140 A * | 5/1999 | Acatrinei | .................... | 323/299 |
| 6,198,403 B1 * | 3/2001 | Dorrough et al. | ........... | 340/635 |
| 6,275,074 B1 * | 8/2001 | Hastings | ...................... | 327/74 |

FOREIGN PATENT DOCUMENTS

| | | |
|---|---|---|
| JP | 53-017374 | 2/1978 |
| JP | 02-176473 | 7/1990 |

\* cited by examiner

AC SIGNAL LEVEL DETECTION CIRCUIT

CONTINUING DATA

This application is a 371 of PCT/JP03/02651, filed Mar. 6, 2003, has been inserted.

TECHNICAL FIELD

The present invention relates to an AC signal level detection circuit which detects a power source voltage supplied from an alternating current power source and outputs a determination signal representing the power source voltage.

BACKGROUND ART

A power unit which receives a commercial alternating current is incorporated into various electronic apparatuses such as AC adaptors, OA apparatuses, consumer apparatuses, etc. It is desired that these electronic apparatuses can suit commercial AC voltages of various countries in the world.

In order to suit electronic apparatuses to commercial AC voltages of various countries, some recent power units have an AC voltage detection circuit as an AC signal level detection circuit. The AC voltage detection circuit detects a power source voltage supplied from an AC power source and generates a determination signal for making the power source voltage identifiable. The power unit switches control manners and circuit protection manners based on the determination signal.

Figure 10:
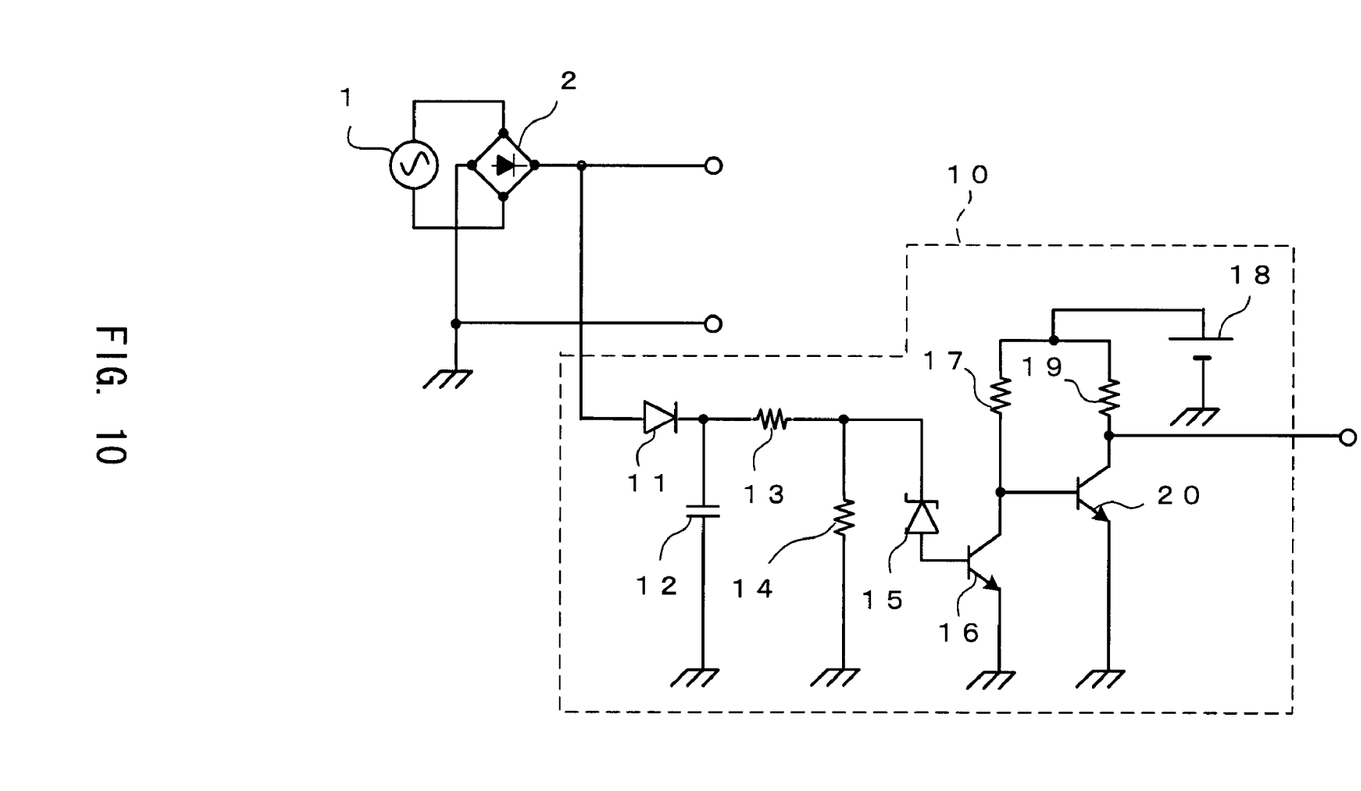
FIG. 10 is a circuit diagram of a conventional AC voltage detection circuit.

An example of conventional AC voltage detection circuit is shown in FIG. 10.

FIG. 10 is a circuit diagram showing a conventional AC voltage detection circuit.

This AC voltage detection circuit 10 is a circuit which generates a determination signal representing whether a power source voltage supplied from an AC power source 1 is, for example, 200 volts or 100 volts, and is provided between a positive electrode of a full-wave rectifying circuit 2 connected to the AC power source 1 and the ground.

The full-wave rectifying circuit 2 rectifies an AC voltage generated by the AC power source 1 and outputs a rectified voltage. A diode 11 whose anode is connected to he positive electrode of the full-wave rectifying circuit 2 charges a capacitor 12 connected between the cathode of this diode 11 and the ground when a voltage in a normal direction is applied thereto. The capacitor 12 is charged with the peak value of the rectified voltage generated by the full-wave rectifying circuit 2.

One terminal of a resistor 13 is connected to a connection node of the capacitor 12 and the cathode of the diode 11, and a resistor 14 is connected between the other terminal of the resistor 13 and the ground. These resistors 13 and 14 divide the charged voltage in the capacitor 12 and output voltages from the connection node between the resistor 13 and resistor 14.

The cathode of a zener diode 15 is connected is connected to the connection node between the resistor 13 and resistor 14, and the anode of the zener diode 15 is connected to the base of an NPN type transistor 16. The corrector of the transistor 16 is connected to the positive electrode of a DC power source 18 via a resistor 17, and the emitter of the transistor 16 is connected to the ground. The corrector of an NPN type transistor 20 is connected to the positive electrode of the DC power source 18 via a resistor 19. The corrector of the transistor 16 is connected to the base of the transistor 20, and the emitter of the transistor 20 is connected to the ground.

When the charged voltage in the capacitor 12 is raised and the voltage of the connection node between the resistor 13 and the resistor 14 is raised, the zener diode 15 reaches breakdown and flows a base current through the transistor 16. Due to this, the transistor 16 is switched on and lowers the corrector voltage of the transistor 16. When the corrector voltage of the transistor 16 is lowered, the transistor 20 is switched off. Due to the transistor 20 being switched off, the voltage of an output terminal connected to the corrector of the transistor 20 is raised. Due to this, that the AC power source 1 supplies a power source voltage of 200 volts is shown to the power unit, etc.

However, the conventional AC voltage detection circuit has the following problem.

Formation of a capacitor on a semiconductor substrate requires much larger area than formation of a transistor device and MOSFET. One capacitor that can actually and practically be formed on an IC (Integrated Circuit) is about 10 [pF].

However, the capacitor 12 shown in FIG. 10 is charged with the peak value of the commercial AC voltage. Since the cycle of the rectified voltage obtained by rectifying the AC voltage is long, about 10 [msec], the capacitor 12 needs to have capacitance of about 100 [nF] or more. Therefore, attempts to miniaturize the entire power unit by forming the AC voltage detection circuit on an IC and to delete the number of add-on components make it difficult to secure the area on the IC that allows capacitance of 100 [nF] or more to be obtained. Moreover, budgeting is unrealistic. Further, it is difficult for a capacitor on an IC chip to retain electric charges over a long cycle of a commercial frequency of several ten [msec], making it difficult to detect the peak voltage. That is, it becomes difficult to miniaturize the power unit by utilization of an IC and to lower the costs required, and reliability of the power unit might be damaged due to increase in the number of add-on components.

DISCLOSURE OF INVENTION

The present invention is an invention made in view of such circumstance, and an object of the present invention is to provide an AC signal level detection circuit which can be miniaturized and manufactured at low costs, and whose reliability is improved.

To achieve the above object, an alternating current signal level detection circuit according to a first aspect of the present invention comprises:

a first determination unit (52, 82) which determines whether or not a signal level of an alternating current signal passes over a first reference voltage (V2) which is higher than zero from a lower side to a higher side;

a second determination unit (40, 70, 90) which determines whether or not the signal level of the alternating current signal exceeds a second reference voltage (V1) which is higher than the first reference voltage (V2);

a storage unit (53, 54, 83, 84) which stores a first determination result of the first determination unit (52, 82) and a second determination result of the second determination unit (40, 70, 90); and a determination signal output unit (53b, 55, 85, 86) which refers to the determination results stored in the storage unit (53, 54, 83, 84), determines whether the signal level of the alternating current signal is high or low based on the determination results referred to, and outputs a high-low determination signal as a result of the determining.

With this configuration, the signal level of the alternating current signal is compared with the first reference voltage and second reference voltage, and a high-low determination signal is output based on a result of this comparison. Therefore, in a case where the alternating current signal is regarded as a alternating current voltage, there is no need of obtaining the peak value of the alternating current voltage, and a capacitor having a large capacitance becomes unnecessary.

The determination signal output unit (53b, 55, 85, 86) may:

refer to the first determination result of the first determination unit (52, 82) and the determination result of the second determination unit (40, 70, 90) which are stored in the storage unit (53, 54, 83, 84);

output a high-low determination signal representing that the signal level of the alternating current signal is high, when the storage unit (53, 54, 83, 84) stores the first determination result representing that the signal level of the alternating current signal passes over the first reference voltage (V2) from the lower side to the higher side, and the second determination result representing that the signal level of the alternating current signal exceeds the second reference voltage (V1); and output a high-low determination signal representing that the signal level of the alternating current signal is low, when the storage unit (53, 54, 83, 84) stores the first determination result representing that the signal level of the alternating current signal passes over the first reference voltage (V2) from the lower side to the higher side and the second determination result representing that the signal level of the alternating current signal is equal to or lower than the second reference voltage (V1).

The determination signal output unit (53b, 55) may output the high-low determination signal by referring to the first determination result and the second determination result stored in the storage unit (53, 54) when the signal level of the alternating current signal passes over the first reference voltage (V2) from the higher side to the lower side.

The determination signal output unit (83b, 85, 86) may output the high-low determination signal by referring to the first determination result and the second determination result stored in the storage unit (83, 84) when the signal level of the alternating current signal exceeds the second reference voltage (V1) and when the signal level of the alternating current passes over the first reference voltage (V2) from the higher side to the lower side.

The first determination unit may comprise a first comparator (52) which compares the signal level of the alternating current signal with the first reference voltage (V2), and outputs, when the signal level of the alternating current signal passes over the first reference voltage (V2) from the lower side to the higher side, the first determination result representing this fact, the second determination unit may comprise a second comparator (42) which compares the signal level of the alternating current signal with the second reference voltage (V1), and outputs, when the signal level of the alternating current signal exceeds the second reference voltage (V1), the second determination result representing this fact, the storage unit may comprise:

a reset signal output unit (53a) which generates and outputs a reset signal (P1) based on the first determination result of the first comparator (52) representing that the signal level of the alternating current signal exceeds the second reference voltage (V1); and a reset-set flip-flop circuit (54) which outputs a Q signal which is reset based on the reset signal (P1) generated by the reset signal generation unit (53a) and which is set based on the second determination result of the second comparator (42) representing that the signal level of the alternating current signal exceeds the second reference voltage (V1), and stores a reset or set status of the Q signal as the first determination result or the second determination result, and the determination signal output unit may comprise:

a timing signal output unit (53b) which generates and outputs a timing signal (P2) based on the first determination result of the first comparator (52) representing that the signal level of the alternating current signal passes over the first reference voltage (V2) from the lower side to the higher side; and a delay flip-flop circuit (55) which refers to the reset or set status of the Q signal output from the reset-set flip-flop circuit (54) when the timing signal (P2) is output from the timing signal output unit (53b), and outputs a signal having a same status as the status referred to, as the high-low determination signal.

The first determination unit may comprise a first comparator (82) which compares the signal level of the alternating current signal with the first reference voltage (V2), and outputs, when the signal level of the alternating current signal passes over the first reference voltage (V2) from the lower side to the higher side, the first determination result representing this fact, the second determination unit may comprise a second comparator (72) which compares the signal level of the alternating current signal with the second reference voltage (V1), and outputs, when the signal level of the alternating current signal exceeds the second reference voltage (V1), the second determination result representing this fact, the storage unit may comprise:

a reset signal output unit (83a) which generates and outputs a reset signal (P1) based on the first determination result of the first comparator (82) representing that the signal level of the alternating current signal exceeds the first reference voltage (V2); and a reset-set flip-flop circuit (84) which outputs a Q signal which is reset based on the reset signal (P1) generated by the reset signal generation unit (83a) and which is set based on the second determination result of the second comparator (72) representing that the signal level of the alternating current signal exceeds the second reference voltage (V1), and stores a reset or set status of the Q signal as the first determination result or the second determination result, and the determination signal output unit may comprise:

a timing signal output unit (83b) which generates and outputs a timing signal (P2) based on the first determination result obtained by determination of the first comparator (82);

a delay flip-flop circuit (85) which refers to the reset or set status of the Q signal output from the reset-set flip-flop circuit (84) when the timing signal (P2) is output from the timing signal output unit (83b), and outputs a signal having a same status as the status referred to; and a logical OR operation unit (86) which implements a logical OR operation of an output signal from the reset-set flip-flop circuit (84) and the delay flip-flop circuit (85), and outputs a result of the logical OR operation as the high-low determination signal.

The alternating current signal level detection circuit may comprise a first power source having the first reference voltage (V2) and a second power source having the second reference voltage (V1), the first power source may lower the first reference voltage (V2), when the signal level of the alternating current signal passes over the first reference voltage (V2) from the lower side to the higher side, and the second power source may lower the second reference voltage, when the signal level passes over the second reference voltage from a lower side to a higher side.

An alternating current signal level detection circuit according to a second aspect of he present invention comprises:

a first determination unit (52) which determines whether or not a signal level of the alternating current signal passes over a first reference voltage (V2) which is higher than zero from a lower side to a higher side;

a second determination unit (43) which determines whether or not the signal level of the alternating current signal exceeds a plurality of second reference voltages (V1, V3) which are higher than the first reference voltage (V2), and outputs either one of them as a second determination result;

a storage unit (53a, 54) which stores a first determination result of the first determination unit (52) and the second determination result output from the second determination unit (43); and a determination signal output unit (53b, 55) which refers to the determination results stored in the storage unit (53a, 54), determines whether the signal level of the alternating current signal is high or low based on the determination results referred to, and outputs a high-low determination signal as a result of the determining.

The alternating current signal level detection circuit may comprise a first power source having the first reference voltage (V2), and a second power source having the second reference voltage (V1), the first power source may lower the first reference voltage (V2) when the signal level of the alternating current signal passes over the first reference voltage (V2) from the lower side to the higher side, and the second power source may lower the second reference voltages (V1, V3) when the signal level passes over the second reference voltages from a lower side to a higher side.

BEST MODE FOR CARRYING OUT THE INVENTION

In the first to third embodiments, an AC signal level detection circuit will be explained as an AC voltage detection circuit, by regarding an AC signal as an AC voltage. However, an AC signal may be regarded not only as an AC voltage but also as an AC current. In this case, the AC signal level detection circuit may be used as an AC current detection circuit.

FIRST EMBODIMENT

Figure 1:
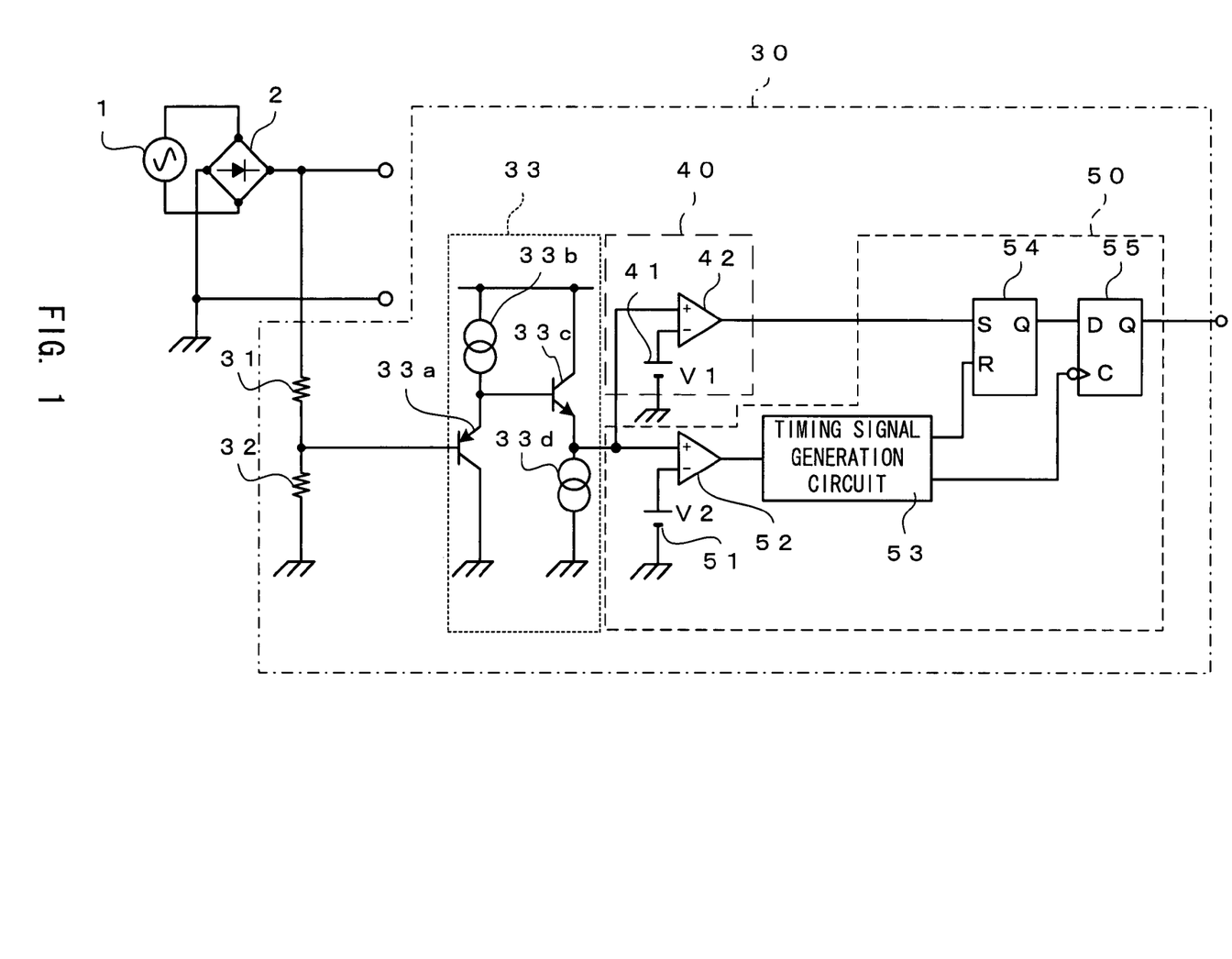
FIG. 1 is a diagram showing an example of configuration of an AC voltage detection circuit according to a first embodiment of the present invention.

FIG. 1 is a configuration diagram showing an AC voltage detection circuit according to the first embodiment of the present invention.

This AC voltage detection circuit 30 is a circuit which detects a power source voltage supplied from an AC power source 1 to an unillustrated power unit and generates a determination signal identifiably representing whether the power source voltage is 100 volts or 200 volts.

The AC voltage detection circuit 30 comprises voltage division resistors 31 and 32 connected to a full-wave rectifying circuit 2, an internal regulator 33, a comparator/detector 40, and a determination signal generator 50.

The full-wave rectifying circuit 2 is connected to the AC power source 1 and supplies a rectified voltage to the power unit. The resistor 31 and the resistor 32 are connected in series between the positive electrode of the full-wave rectifying circuit 2 and the ground. The connection node of the resistor 31 and resistor 32 is connected to the base of a PNP type transistor 33a in the internal regulator 33.

The corrector of the transistor 33a is connected to the ground, and the emitter of the transistor 33a is connected to a power source wiring via a constant current source 33b. The emitter of the transistor 33a is further connected to the base of an NPN type transistor 33c. The corrector of the transistor 33c is connected to the power source wiring, and the emitter of the transistor 33c is connected to the ground via a constant current source 33d. The emitter of the transistor 33c is the output terminal of the internal regulator 33. The comparator/detector 40 and the determination signal generator 50 are connected to the emitter of the transistor 33c.

The comparator/detector 40 comprises a power source 41 which generates a reference voltage V1, and a comparator 42. The power source 41 is connected to one input terminal (−) of the comparator 42. The reference voltage V1 is a voltage for detecting whether a power source voltage supplied from the AC power source 1 is 100 volts or 200 volts, and may be set to, for example, around AC 160 [V] as a detection point. The emitter of the transistor 33c is connected to the other input terminal (+) of the comparator 42.

The determination signal generator 50 comprises a power source 51 which generates a reference voltage, a comparator 52, a timing signal generation circuit 53, a reset flip flop (hereinafter referred to as RS-FF) 54 as a cycle determination circuit, and a delay flip flop (hereinafter referred to as D-FF) 55 as a signal generation circuit.

One input terminal (+) of the comparator 52 is connected to the emitter of the transistor 33c, and the other input terminal (−) of the comparator 52 is connected to the power source 51. The output terminal of the comparator 52 is connected to the timing signal generation circuit 53.

Figure 2:
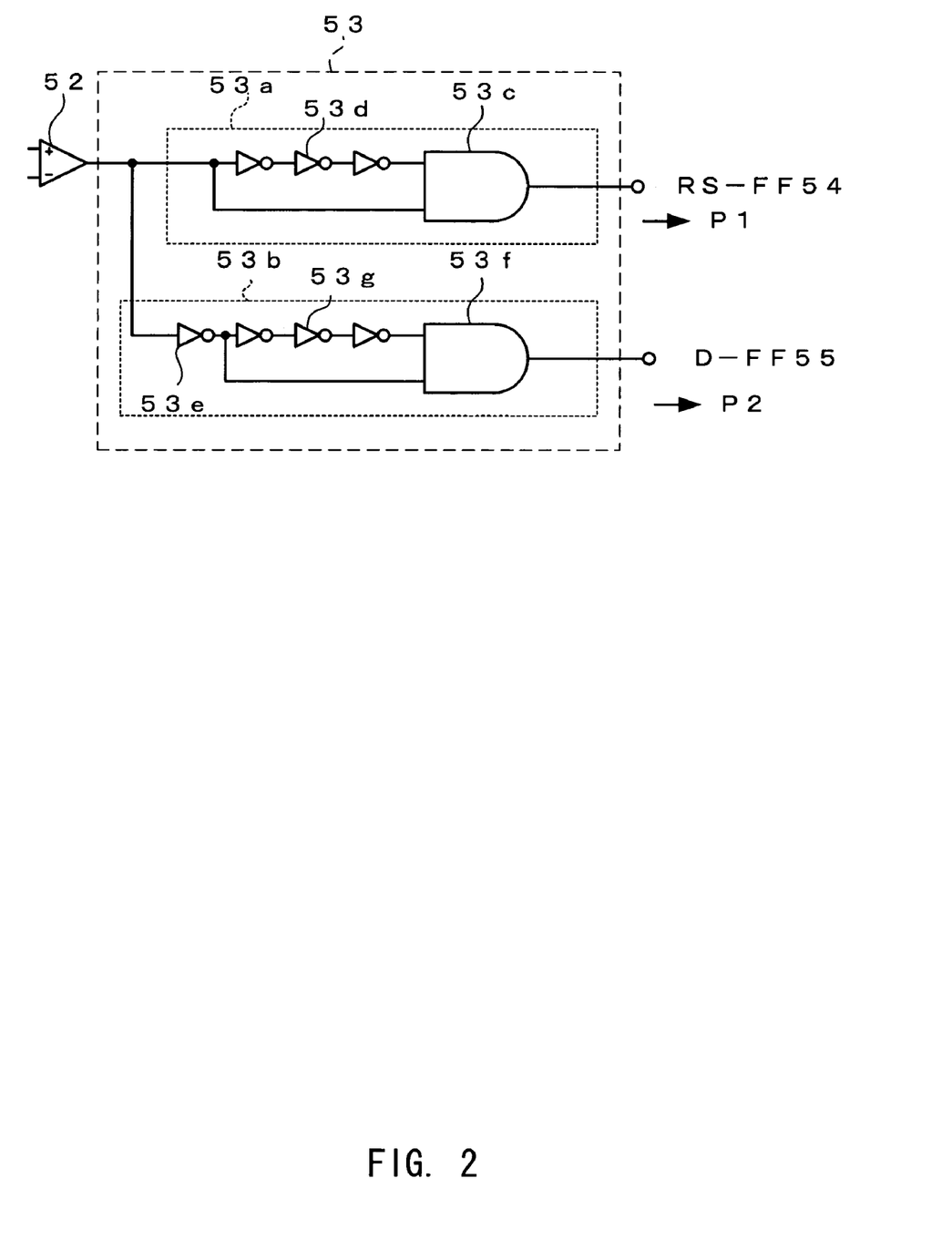
FIG. 2 is a diagram showing an example of configuration of a timing signal generation circuit in FIG. 1.

The timing signal generation circuit 53 is configured, for example, as shown in FIG. 2.

FIG. 2 is a diagram showing an example of configuration of the timing signal generation circuit 53.

The timing signal generation circuit 53 is configured with a one-shot pulse generation circuit 53a which detects a rise of an output signal from the comparator 52 and generates a pulse of one shot, and a one-shot pulse generation circuit 53b which detects a fall of an output signal from the comparator 52 and generates a pulse of one shot.

The one-shot pulse generation circuit 53a comprises an AND circuit 53c whose one input terminal is connected to the output terminal of the comparator 52, and an odd number of inverters 53d which are connected in series between the other input terminal of the AND circuit 53c and the output terminal of the comparator 52.

The one-shot pulse generation circuit 53b comprises an AND circuit 53f whose one input terminal is connected to the output terminal of the comparator 52 via an inverter 53e, and an odd number of inverters 53g which are connected in series between the output terminal of the inverter 53e and the other input terminal of the AND circuit 53f.

The output terminal of the AND circuit 53c in the one-shot pulse generation circuit 53a is connected to a reset terminal (R) of the RS-FF 54 as a cycle determination circuit.

The output terminal of the comparator 42 is connected to a set terminal (S) of the RS-FF 54. The output terminal (Q) of the RS-FF 54 is connected to a data input terminal (D) of the D-FF 55 as a signal generation circuit.

The output terminal of the AND circuit 53f in the one-shot pulse generation circuit 53b is connected to a clock terminal (C) of the D-FF 55. The output terminal (Q) of the D-FF 55 functions as the output terminal of the AC voltage detection circuit 30.

Figure 3:
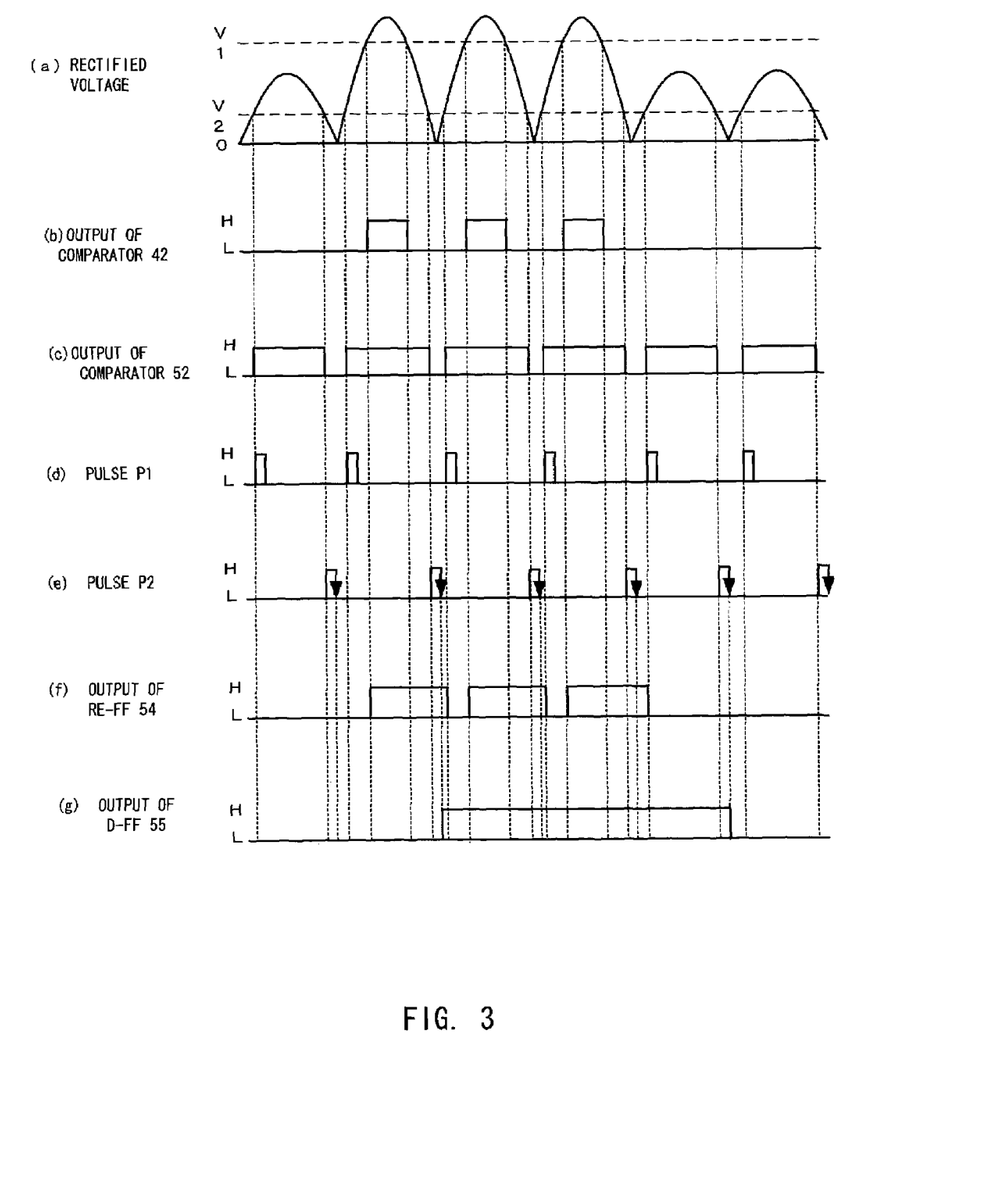
FIGS. 3 are time charts showing the operation of the AC voltage detection circuit in FIG. 1.

Next, the operation of the AC voltage detection circuit 30 will be explained with reference to FIGS. 3(a) to (g).

FIGS. 3(a) to (g) are time charts for explaining the operation of the AC voltage detection detection circuit 30.

The full-wave rectifying circuit 2 full-wave-rectifies an AC voltage generated by the AC power source 1 to generate a rectified voltage. This rectified voltage is supplied to the unillustrated power unit, etc. The resistors 31 and 32 divide the rectified voltage, and the internal regulator 33 shapes the waveform of the rectified voltage divided by the resistors 31 and 32 as shown in FIG. 3(a).

The comparator 42 in the comparator/detector 40 compares the reference voltage V1 generated by the power source 41 with the rectified voltage output from the internal regulator 33, and outputs a high level (hereinafter referred to as "H") when the instantaneous value of the rectified voltage exceeds the reference voltage V1. Due to this, as shown in FIG. 3(b), periods in which the instantaneous value of the rectified voltage generated by the full-wave rectifying circuit 2 is exceeding the voltage corresponding to the reference voltage V1 are detected. When the AC power source 1 is supplying a 200 volt power source voltage to the power unit, the output signal of the comparator 42 is "H". When the AC power source 1 is supplying a 100 volt power source voltage to the power unit, the output signal of the comparator 42 remains "L". When the output signal of the comparator 42 becomes "H", the RS-FF 54 is set, and the RS-FF 54 outputs "H" as shown in FIG. 3(f).

In the meantime, the comparator 52 compares the rectified voltage output from the internal regulator 33 with the reference voltage V2 generated by the power source 51, and outputs "H" when the output voltage of the internal regulator 33 exceeds the reference voltage V2. Due to this, as shown in FIG. 3(c), periods in which the rectified voltage output from the full-wave rectifying circuit 2 exceeds the voltage corresponding to the reference voltage V2 are detected.

The one-shot pulse generation circuit 53a in the timing signal generation circuit 53 generates a pulse P1 of one shot at timings at which the output signal of the comparator 52 rises to "H", as shown in FIG. 3(d). The one-shot pulse generation circuit 53b generates a pulse P2 of one shot at timings at which the output signal of the comparator 52 falls to "L", as shown in FIG. 3(e).

When the one-shot pulse generation circuit 53a generates a pulse P1, the RS-FF 54 is reset, and the RS-FF 54 outputs "L". Accordingly, out of the cycles of the rectified voltage output from the full-wave rectifying circuit 2, cycles in which the instantaneous value of the rectified voltage exceeds the reference voltage V1 are detected. The output signal of the RS-FF 54 becomes "H" when these cycles are detected.

The pulse P2 output from the one-shot pulse generation circuit 53b is supplied to the clock terminal (C) of the D-FF 55. The D-FF 55 latches the output signal from the RS-FF 54 in synchronization with a fall of the pulse P2 output from the one-shot pulse generation circuit 53b, and outputs the latched output signal from the output terminal (Q). If cycles of the rectified voltage in which the instantaneous value of the rectified voltage exceeds the reference voltage V1 continue, by the D-FF 55 latching the output signal of he RS-FF 54 in synchronization with the pulse generated by the one-shot pulse generation circuit 53b as described above, the D-FF 55 continuously outputs "H" during hat period as shown in FIG. 3(g). That is, the output signal of the D-FF 55 becomes a determination signal representing that the AC power source 1 is supplying a 200 volt power source voltage, and is supplied to the unillustrated power unit. The power unit performs control based on the determination signal supplied from the D-FF 55.

As described above, the voltage detection circuit 30 of the present embodiment has he following advantages.

(1) Since the comparator 42 compares the rectified voltage obtained by rectifying an AC voltage with the reference voltage V1 to detect periods in which the instantaneous value of the rectified voltage exceeds the reference voltage V1, and the power source voltage supplied from the AC power source 1 is determined based on the detection result, a capacitor for the AC voltage to detect the peak value of the rectified voltage becomes unnecessary unlike conventional. Therefore, the AC voltage detection circuit can be miniaturized and manufactured at a lower cost. Accordingly, various electronic circuits in which the AC voltage detection circuit is incorporated can be manufactured at a lower cost and miniaturized. Particularly, there is an advantage that such electronic circuits can be formed on integrated circuits.

(2) The pulses P1 and P2 which are synchronous with the frequency of the rectified voltage are generated by the timing signal generation circuit 53, and cycles in which the instantaneous value of the rectified voltage exceeds the reference voltage V1 are detected by the RS-FF 54 by using these pulses P1 and P2, and a determination signal is generated by the D-FF 55. Therefore, even from a pulsating voltage like a rectified voltage, a determination signal stably representing that a 200 volt power source voltage is supplied can be generated. Further, even if the frequency of the AC voltage 1 changes, it is possible to detect the power source voltage.

SECOND EMBODIMENT

Figure 4:
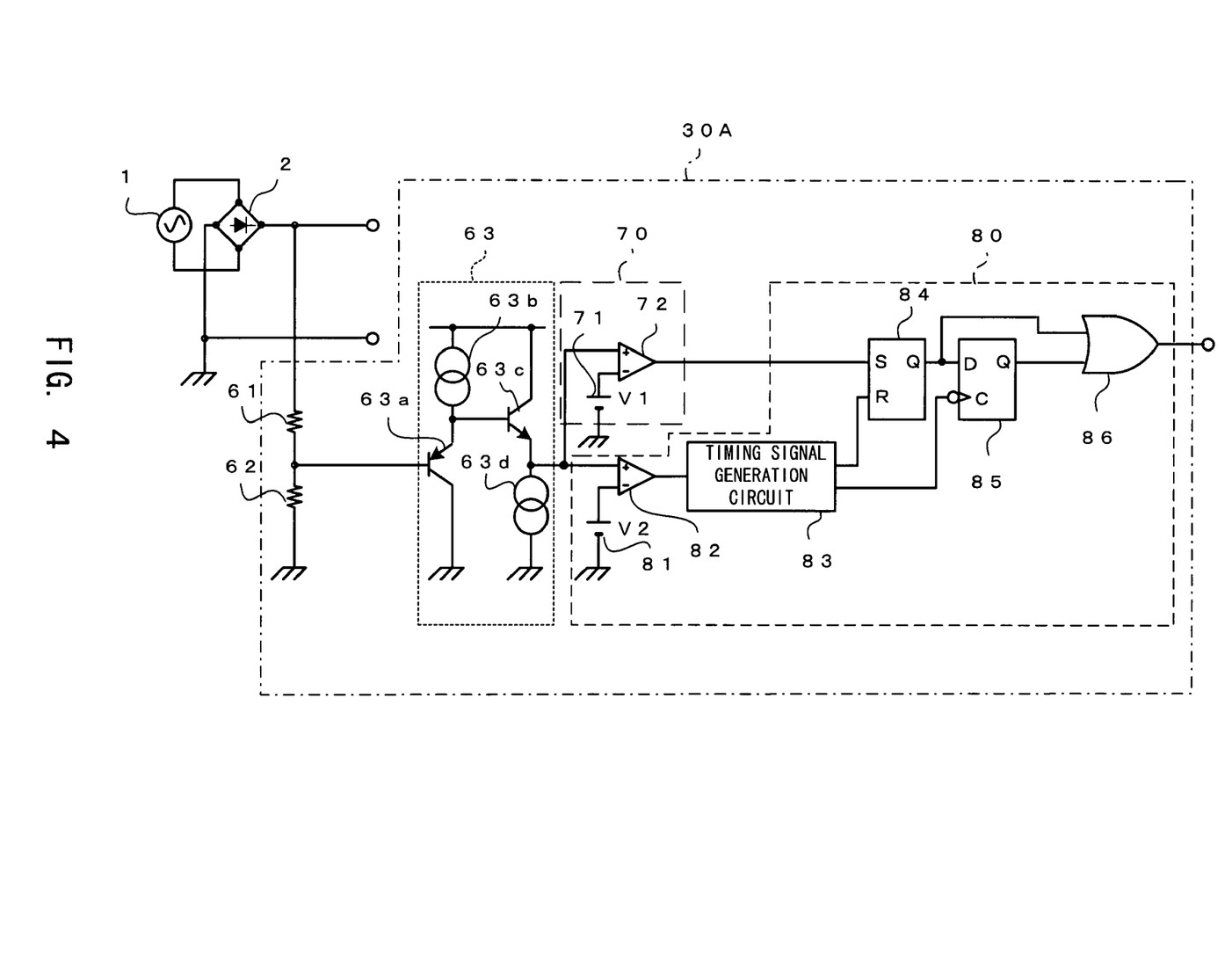
FIG. 4 is a diagram showing an example of configuration of an AC voltage detection circuit according a second embodiment of the present invention.

FIG. 4 is a diagram showing an example of configuration of an AC voltage detection circuit according to the second embodiment of the present invention.

This AC voltage detection circuit 30A comprises voltage division resistors 61 and 62 connected to a full-wave rectifying circuit 2, an internal regulator 63, a comparator/detector 70, and a determination signal generator 80.

The resistor 61 and resistor 62 correspond to the resistors 31 and 32 of the first embodiment, and are connected in series between the positive electrode of the full-wave rectifying circuit 2 and the ground. The internal regulator 63 corresponds to the internal regulator 33 of the first embodiment, and the connection node of the resistor 61 and resistor 62 is connected to the base of a PNP type transistor 63 in the internal regulator 63.

The corrector of the transistor 63a is connected to the ground, and the emitter of the transistor 63a is connected to a power source wiring via a constant current source 63b. The emitter of the transistor 63a is further connected to the base of an NPN type transistor 63c. The corrector of the transistor 63c is connected to the power source wiring, and the emitter of the transistor 63c is connected to the ground via a constant current source 63d. The emitter of the transistor 63c is the output terminal of the internal regulator 63. The comparator/detector 70 and the determination signal generator 80 are connected to the emitter of the transistor 63c.

The comparator/detector 70 is similar to the comparator/detector 40 of the first embodiment, and comprises a power source 71 which generates a reference voltage V1, and a comparator 72. The power source 71 is connected to one input terminal (−) of the comparator 72. The emitter of the transistor 63c is connected to the other input terminal (+) of the comparator 72.

The determination signal generator 80 comprises a power source 81 which generates a reference voltage V2, a comparator 82, a timing signal generation unit 83, an RS-FF 84, and a D-FF 85, and further comprises a two-input OR circuit 86.

The power source 81, comparator 82, timing signal generation unit 83, RS-FF 84, and D-FF 85 are similar to the power source 51, comparator 52, timing signal generation circuit 53, RS-FF 54, and D-FF 55 of the first embodiment, and are connected similarly.

One input terminal of the OR circuit 86 is connected to the output terminal (Q) of the RS-FF 84. The other input terminal of the OR circuit 86 is connected to the output terminal (Q) of the D-FF 85, and the output terminal of the OR circuit 86 is the output terminal of the determination signal generator 80.

Figure 5:
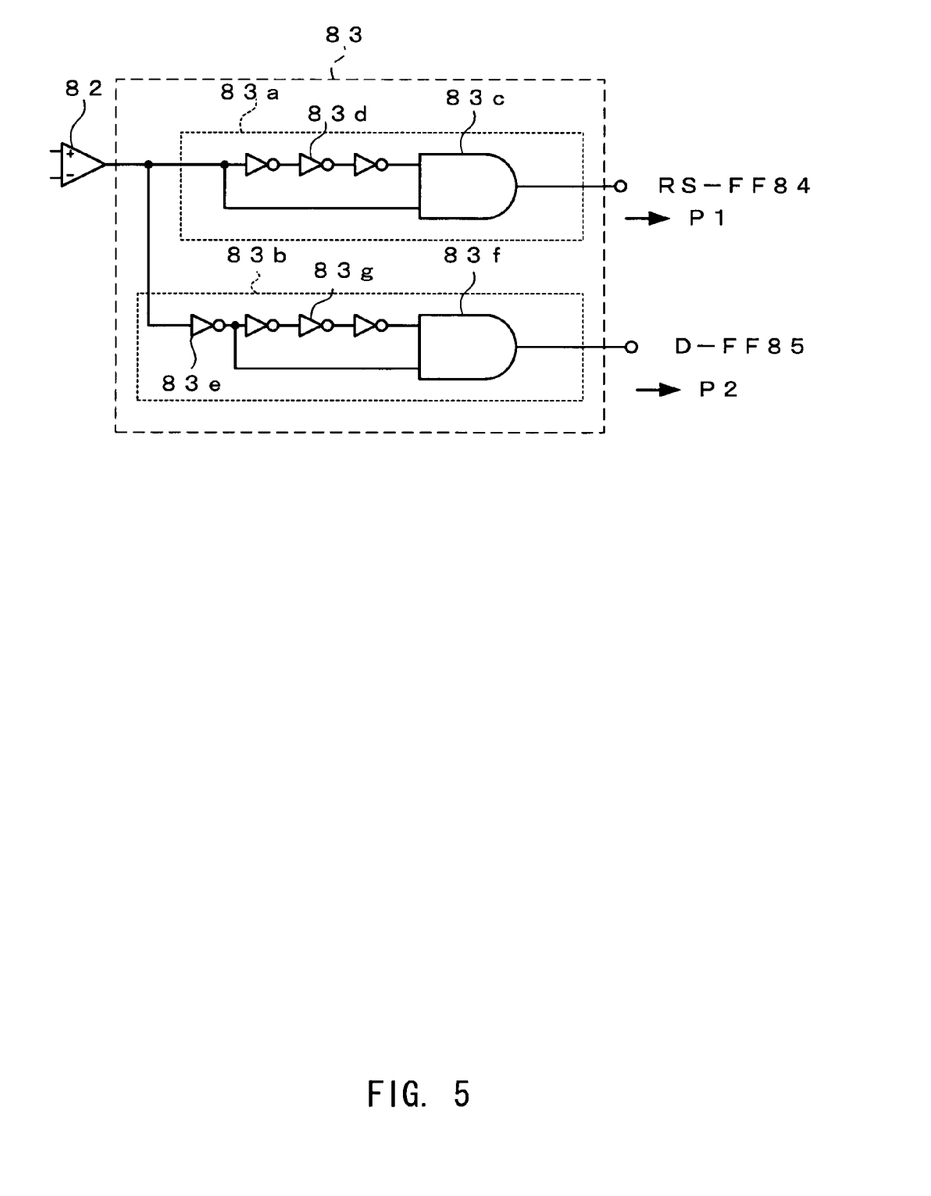
FIG. 5 is a diagram showing an example of configuration of a timing signal generation circuit in FIG. 4.

The timing signal generation circuit 83 is similar to the timing signal generation circuit 53 shown in FIG. 1, and is configured as shown in FIG. 5.

The timing signal generation circuit 83 comprises a one-shot pulse generation circuit 83a which detects a rise of an output signal of the comparator 82 and generates a pulse of one shot, and a one-shot pulse generation circuit 83b which detects a fall of the output signal of the comparator 82 and generates a pulse of one shot.

The one-shot pulse generation circuit 83a comprises an AND circuit 83c whose one input terminal is connected to the output terminal of the comparator 82, and an odd number of inverters 83d which are connected in series between the other input terminal of the AND circuit 83c and the output terminal of the comparator 82.

The one-shot pulse generation circuit 83b comprises an AND circuit 83f whose one input terminal is connected to the output terminal of the comparator 82 via an inverter 83e, and an odd number of inverters 83g which are connected in series between the output terminal of the inverter 83e and the other input terminal of the AD circuit 83f.

The output terminal of the AND circuit 83c in the one-shot pulse generation circuit 83a is connected to a reset terminal (R) of the RS-FF 84.

The output terminal of the AND circuit 83f in the one-shot pulse generation circuit 83b is connected to a clock terminal (C) of the D-FF 85.

Figure 6:
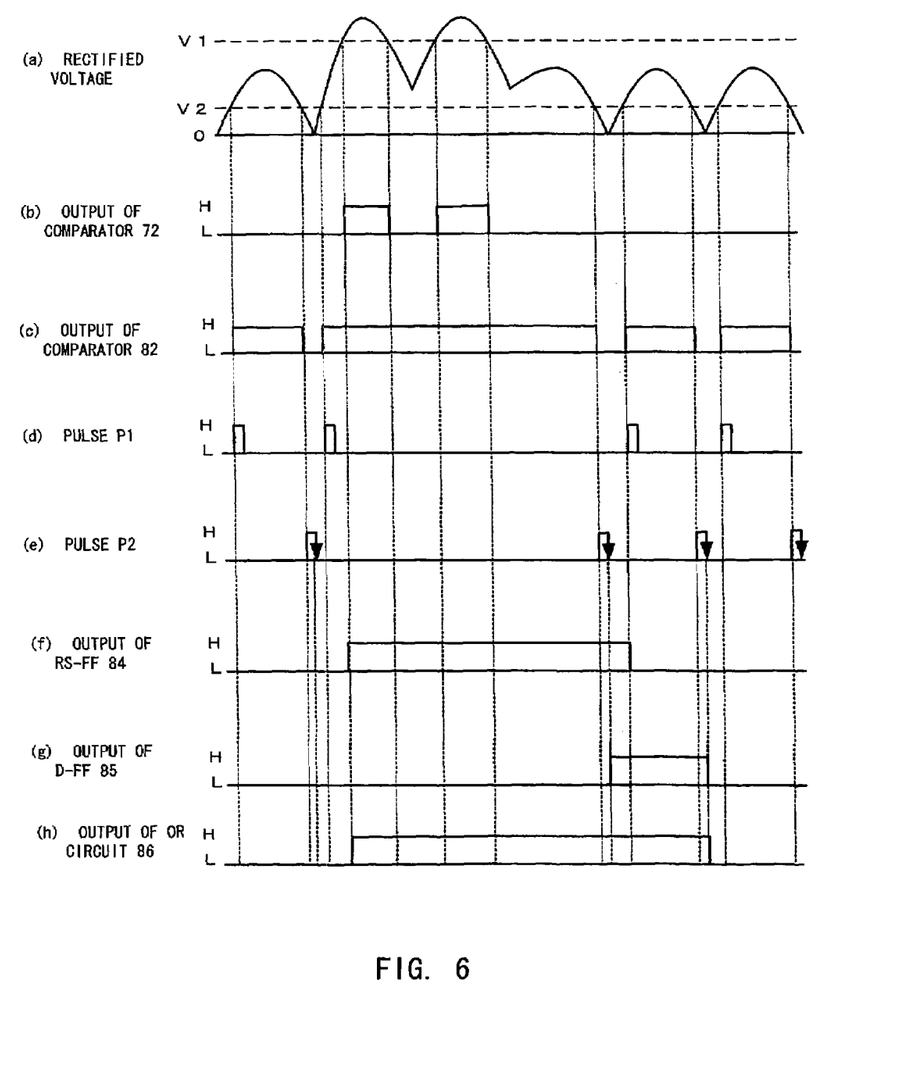
FIG. 6 are time charts showing the operation of the AC voltage detection circuit in FIG. 4.

Next, the operation of the AC voltage detection circuit 30A will be explained with reference to FIGS. 6(a) to (h).

FIGS. 6(a) to (h) are time charts for explaining the operation of the AC voltage detection detection circuit 30A.

The full-wave rectifying circuit 2 full-wave rectifies an AC voltage generated by the AC power source 1, and generates a rectified voltage. The resistors 61 and 62 divide the rectified voltage. The internal regulator 63 shapes the waveform of the rectified voltage divided by the resistors 61 and 62, as shown in FIG. 6(a).

The comparator 72 in the comparator/detector 70 compares the reference voltage V1 generated by the power source 71 with the rectified voltage output from the internal regulator 63, and outputs "H" when the instantaneous value of the rectified voltage exceeds the reference value V1. Due to this, as shown in FIG. 6(b), periods in which the instantaneous value of the rectified voltage generated by the full-wave rectifying circuit 2 exceeds the voltage corresponding to the reference voltage V1 are detected. When the AC power source 1 is supplying a 200 volt power source voltage to the power unit, the output signal of the comparator 72 becomes "H". When the AC power source 1 is supplying a 100 volt power source voltage to the power unit, the output signal of the comparator 72 remains "L". When the output signal of the comparator 72 becomes "H", he RS-FF 84 is set, and the RS-FF 84 outputs "H" as shown in FIG. 6(f).

In the meantime, the comparator 82 compares the rectified voltage output from the internal regulator 63 with the reference voltage V2 generated by the power source 81, and outputs "H" when the output voltage of the internal regulator 63 exceeds the reference voltage V2, as shown in FIG. 6(c).

The timing signal generation circuit 83 generates a pulse P1 of one shot at timings at which the output signal of the comparator 82 rises to "H" as shown in FIG. 6(d), and generates a pulse P2 of one shot at timings at which the output signal of the comparator 82 falls to "L" as shown in FIG. 6(e).

A case is considered where, by inserting a noise elimination capacitor between the positive electrode of the full-wave rectifying circuit 2 and the ground, the rectified voltage output from the internal regulator 63 does not fall below the reference voltage V2 as shown in FIG. 6(a) when the power source voltage supplied from the AC power source 1 is 200 volts. In such a case, since the output signal of the comparator 82 is fixed at "H", the pulse P2 are not generated and the output signal of the RS-FF 84 s fixed at "H". During a period in which the output signal of the RS-FF 84 is fixed at "H", the output signal of the OR circuit 86 becomes "H", which represents that the power source voltage supplied from the AC power source 1 is 200 volts.

When the power source voltage supplied from the AC power source 1 changes to 100 volts and the instantaneous value of the rectified voltage becomes lower than the voltage corresponding to the reference voltage V2, the output signal of the comparator 82 changes to "L". The timing signal generation circuit 83 generates the pulse P2 each time the output signal of the comparator 82 changes to "L" as shown in FIG. 6(*e*). Meanwhile, when the power source voltage becomes 100 volts, the output signal of the comparator 72 is fixed to "L". Accordingly, the RS-FF 84 is not set and the output signal of the RS-FF 84 becomes "L". At timings at which the pulse P2 falls, the output signal of the D-FF 85, which latches "L" of the output signal of the RS-FF 84, becomes "L". At these timings, the output signal of the OR circuit 86 changes to "L". That is, the change in the power source voltage supplied from the AC power source 1 from 200 volts to 100 volts is represented.

As described above, according to the AC voltage detection circuit 30A of the present embodiment, it is possible not only to realize miniaturization and lower-cost manufacturing of the AC voltage detection circuit 30A because there is no necessity for a capacitor for detecting the peak value of the rectified voltage likewise the first embodiment, but also to represent by a determination signal that a power source voltage of 200 volts is supplied even in a case where the power source voltage supplied from the AC power source 1 is 200 volts and its rectified voltage does not fall below the voltage corresponding to the reference voltage V2, because the OR circuit 86 is provided.

THIRD EMBODIMENT

Figure 7:
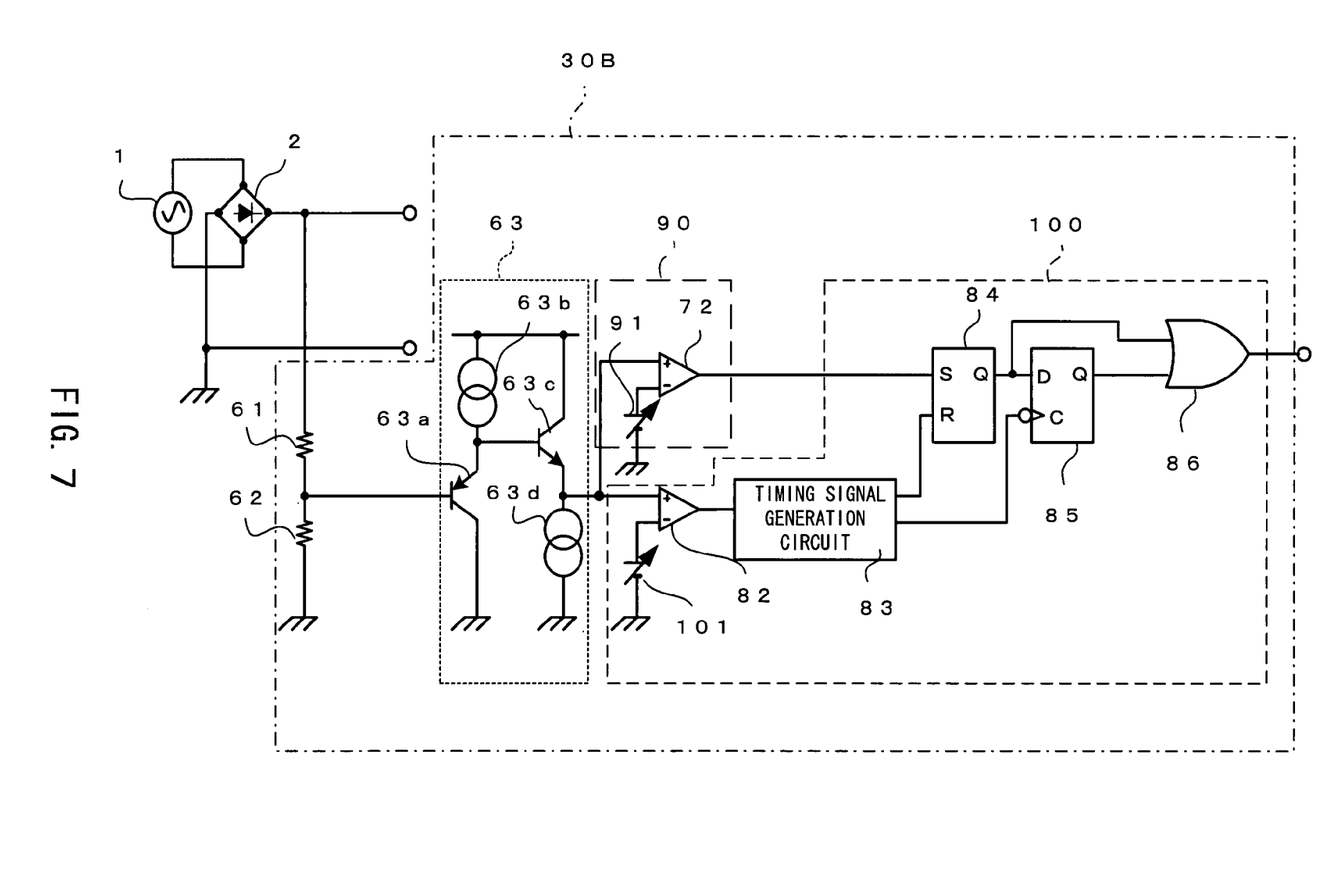
FIG. 7 is a diagram showing an example of configuration of an AC voltage detection circuit according to a third embodiment of the present invention.

FIG. 7 is a diagram showing an example of configuration of an AC voltage detection circuit according to the third embodiment of the present invention, where components common to the components of the second embodiment shown in FIG. 4 are give the same reference numerals.

This AC voltage detection circuit 30B is obtained by replacing the comparator/detector 70 and determination signal generation unit 80 in the AC voltage detection circuit of the second embodiment with a comparator/detector 90 and determination signal generation unit 100 shown in FIG. 7. The other components are the same as the second embodiment.

The comparator/detector 90 comprises a power source 91 and a comparator 72. The power source 91 generates a reference voltage lower than a reference voltage V1, when the rectified voltage generated by the internal regulator 63 rises and the output of the comparator 72 changes from "L" to "H". The power source 91 changes the reference voltage that has been lower than the voltage V1 to the original reference voltage V1, when the rectified voltage generated by the internal regulator 63 lowers and the output of the comparator 72 changes from "H" to "L". The reference voltage generated by this power source 91 is used as a voltage for detecting that a power source voltage of 200 volts is supplied. The comparator 72 is the same as the comparator 72 in the comparator/detector 70 of the second embodiment, and one input terminal (+) of the comparator 72 is connected to the output terminal of the internal regulator 63. The other input terminal (−) of the comparator 72 is connected to the power source 91.

The determination signal generation unit 100 is constituted by replacing the power source 81 in the determination signal generation unit 80 of the second embodiment with a power source 101. The other components are the same as the determination signal generation unit 80. The power source 101 generates a reference voltage lower than the reference voltage V2, when the rectified voltage generated by the internal regulator 63 rises and the output of the comparator 82 changes from "L" to "H". The power source 101 changes the reference voltage which has been lower than the voltage V2 to the original reference voltage V2, when the rectified voltage generated by the internal regulator 63 lowers and the output of the comparator 82 changes from "H" to "L". The power source 101 is connected to the input terminal (−) of the comparator 82.

In this AC voltage detection circuit, the power source 91 and power source 101 generate varied reference voltages in accordance with whether it is when the rectified voltage rises or when the rectified voltage lowers, and the comparator 72 and comparator 82 compare the varied reference voltages with the rectified voltage. Therefore, hysteresis is provided between the reference voltage when the output signal of the comparators 72 and 82 changes form "L" to "H" and the reference voltage when the output signal changes from "H" to "L". Therefore, even when the rectified voltage generated by the internal regulator 63 fluctuates due to a noise, the output signal of the comparators 72 and 82 which has once changed to "H" is prevented from being "L" again, and the accuracy of detection of the power source voltage is improved.

The other operations are the same as the second embodiment. A determination signal of "H" is supplied to the power unit when a power source voltage of 200 volts is supplied from the AC power source 1, and a determination signal of "L" is supplied to the power unit when a power source voltage of 100 volts is supplied.

In the AC voltage detection circuit 30B of the present embodiment as described above, the power sources 91 and 101 are provided to vary the reference voltages to be supplied to the comparators 72 and 82 in accordance with whether it is when the rectified voltage generated by the internal regulator 63 rises or when it lowers. Therefore, an AC voltage detection circuit which is resistant to noise can be constituted.

The present invention is not limited to the above-described embodiments, but may e variously modified. Examples of such modifications are as follows.

(1) In the first to third embodiments, the internal regulators 33 and 63 are provided. However, the internal regulators 33 and 63 may be omitted, and the rectified voltage generated by the full-wave rectifying circuit 2 may be input to the comparators 42, 52, 72 and 82 via the voltage division resistors 31, 32, 61, and 62.

Figure 8:
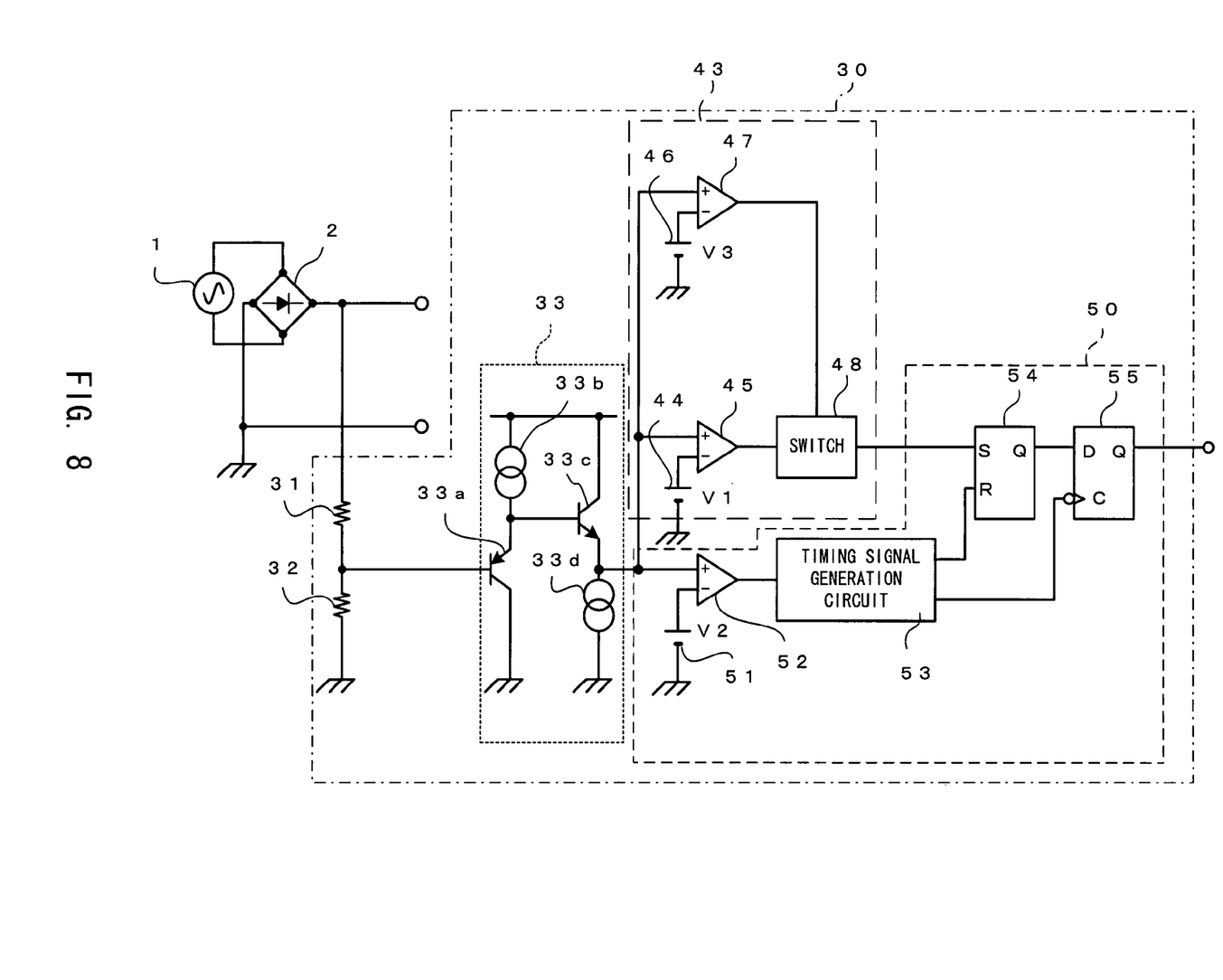
FIG. 8 is a circuit diagram showing a modified example of the AC voltage detection circuit according to the first embodiment of the present invention.

(2) In the first to third embodiments, the example of configuration for determining power source voltages of two kinds, namely 100 volt and 200 volt has been shown. However, the present invention is not limited to this, but two comparators 45 and 47 and a switch 48 may be provided in a comparator/detector 43 as shown in FIG. 8.

A power source 44 is connected to one input terminal (−) of the comparator 45. The reference voltage V1 is a voltage for detecting whether the power source voltage supplied from the AC power source 1 is 100 volts or 200 volts likewise the first embodiment, and is set to, for example, around AC 160 [V] as a detection point.

A power source 46 is connected to one input terminal (−) of the comparator 47. A reference voltage V3 is a voltage for detecting whether the power source voltage supplied from the AC power source 1 is, for example, 300 volts or not, and may be set to, for example, around AC 260 [V] as a detection point. The emitter of the transistor 33c is connected to the other input terminals (+) of the comparators 45 and 47.

The switch 48 selectively outputs the output signal of any one of the comparators 45 and 47.

With this configuration, by comparing the rectified voltage with not only one reference voltage V1, but a plurality of reference voltages V1 and V3 and generating the determination signal based on the comparison result, it is possible to determine three kinds of power source voltages. Furthermore, if the number of comparators is increased, four or more kinds of power source voltages can be determined.

Figure 9:
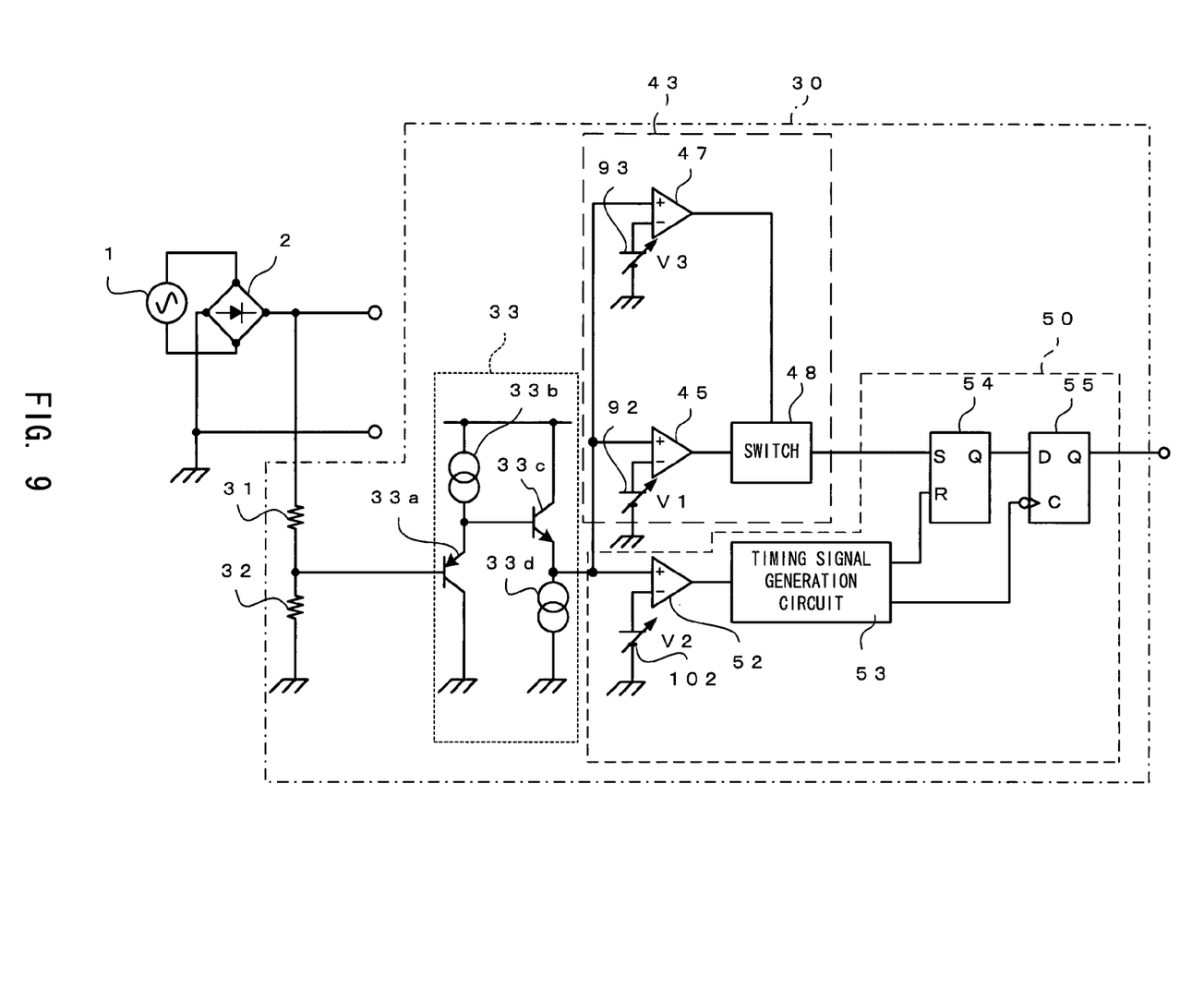
FIG. 9 is a circuit diagram showing a modified example of the AC voltage detection circuit shown in FIG. 8.

(3) Further, as shown in FIG. 9, also in the voltage detection circuit shown in FIG. 8, the comparator/detector 43 may include power sources 92 and 93 which function in the same manner as that of the power source 91 shown in FIG. 7, and the determination signal generation unit 50 may also include a power source 102 which function in the same manner as that of the power source 101 shown in FIG. 7.

Then, by varying the reference voltages V1, V2, and V3 to be supplied from the power sources 92, 93, and 102 to the comparators 45, 47, and 52 in accordance with whether it is when the rectified voltage rises or when it lowers, hysteresis can be provided.

(4) In the third embodiment, hysteresis is provided by varying the reference voltages to be supplied to the comparators 72 and 82 in accordance with whether it is when the rectified voltage rises or when it lowers. However, the reference voltages may be fixed and the rectified voltage to be input to the comparators 72 and 82 may be changed when the rectified voltage passes over the reference voltages. Also in this manner, hysteresis can be provided likewise the third embodiment.

(5) In the explanation of the first to third embodiments, the rectified voltage is an AC signal having a voltage in a positive direction. However, the present invention is not limited to this, but the present embodiments can be applied also in a case where the rectified voltage is a voltage in a negative direction. In this case, an AC signal obtained by reversing the rectified voltage may be generated and determination of whether the signal level of this AC signal is high or low may be done.

This application is based on Japanese Patent Application No. 2002-60059 filed on Mar. 6, 2002 and the specification, claims, and drawings thereof are incorporated herein by reference in its entirety.

INDUSTRIAL APPLICABILITY

The present invention can be applied to industrial fields where a voltage detection circuit is used.

The invention claimed is:

1. An alternating current signal level detection circuit comprising:
    a first comparator (52, 82) which receives a rectified voltage obtained by rectifying an alternating current signal generated by an alternating current power source, compares an instantaneous value of the rectified voltage with a first reference voltage (V2), and represents by a first comparison result periods in which the instantaneous value exceeds the first reference voltage;
    a second comparator (40, 70, 90) which compares the instantaneous value of the rectified voltage with a second reference voltage (V1) which is higher than the first reference voltage, and represents by a second comparison result periods in which the instantaneous value exceeds the second reference voltage;
    a storage unit (53a, 54, 83a, 84) which stores information representing whether or not the rectified voltage exceeds the second reference voltage in each period in which the instantaneous value exceeds the first reference voltage (V2), based on the first comparison result and the second comparison result; and
    a determination signal output unit (53b, 55, 83b, 85, 86) which represents by a high-low determination signal whether a level of the alternating current signal generated by said alternating current power source is high or low in each cycle of the rectified voltage, based on the information stored in said storage unit.

2. The alternating current signal level detection circuit according to claim 1, wherein said determination signal output unit represents by the high-low determination signal that the level of the alternating current signal generated by said alternating current power source is high when said storage unit stores information representing that the rectified voltage exceeds the second reference voltage, and represents by the high-low determination signal that the level of the alternating current signal generated by said alternating current power source is low when said storage unit stores information representing that the rectified voltage does not exceed the second reference voltage.

3. The alternating current signal level detection circuit according to claim 1, wherein the rectified voltage is a voltage obtained by full-wave-rectifying the alternating current signal.

4. The alternating current signal level detection circuit according to claim 2, wherein said determination signal output unit (53b, 55) represents by the high-low determination signal whether the level of the alternating current signal is high or low by referring to the information stored in said storage unit (53a, 54) when a level of the rectified voltage passes over the first reference voltage (V2) from a higher side to a lower side.

5. The alternating current signal level detection circuit according to claim 2, wherein said determination signal output unit (83b, 85, 86) represents by the high-low determination signal whether the level of the alternating current signals high or low by referring to the information stored in said storage unit (83a, 84) when a level of the rectified voltage exceeds the second reference voltage (V1) and when the level of the rectified voltage passes over the first reference voltage (V2) from a higher side to a lower side.

6. The alternating current signal level detection circuit according to claim 4, wherein
    said storage unit comprises:
        a reset signal output unit (53a) which generates and outputs a reset signal (P1) based on the first comparison result of said first comparator (52) when the instantaneous value of the rectified voltage passes over the first reference voltage (V2) from the lower side to the higher side; and
        a reset-set flip-flop circuit (54) which outputs a Q signal which is reset based on the reset pulse (P1) generated by said reset signal output unit (53a) and which is set based on the second comparison result of said second comparator (42) representing that the instantaneous value of the rectified voltage exceeds the second reference voltage (V1), and stores a reset or set status of the Q signal, and
    said determination signal output unit comprises:
        a timing signal output unit (53b) which generates and outputs a timing signal (P2) based on the first comparison result of said first comparator (52) when the instantaneous value of the rectified voltage passes over the first reference voltage (V2) from the higher side to the lower side; and a delay flip-flop circuit (55) which refers to the reset or set status of the Q signal output from said reset-set flip-flop circuit (54) when the timing signal (P2) is output from said timing signal output unit (53b), and outputs a signal having a same status as the status referred to as the high-low determination signal.

7. The alternating current signal level detection circuit according to claim 5, wherein
said storage unit comprises:
a reset signal output unit (83a) which generates and outputs a reset signal (P1) based on the first comparison result of said first comparator (82) representing that the instantaneous value of the rectified voltage exceeds the first reference voltage (V2); and
a reset-set flip-flop circuit (84) which outputs a Q signal which is reset based on the reset signal (P1) generated by said reset signal generation unit (83a) and which is set based on the second comparison result of said second comparator (72) representing that the instantaneous value of the rectified voltage exceeds the second reference voltage (V1), and stores a reset or set status of the Q signal as the information, and
said determination signal output unit comprises:
a timing signal output unit (83b) which generates and outputs a timing signal (P2) based on the first com parison result obtained by determination of said first comparator (82);

a delay flip-flop circuit (85) which refers to the reset or set status of the Q signal output from said reset-set flip-flop circuit (84) when the timing signal (P2) is output from said timing signal output unit (83b), and outputs a signal having a same status as the status referred to; and a logical OR operation unit (86) which implements a logical OR operation of an output signal from said reset-set flip-flop circuit (84) and said delay flip-flop circuit (85), and outputs a result of the logical OR operation as the high-low determination signal.

8. The alternating current signal level detection circuit according to claim 2, comprising a first power source having the first reference voltage (V2) and a second power source having the second reference voltage (V1), wherein:
said first power source lowers the first reference voltage (V2) when the instantaneous value of the rectified voltage passes over the first reference voltage (V2) from a lower side to a higher side; and
said second power source lowers the second reference voltage when the instantaneous value of the rectified voltage passes over the second reference voltage from a lower side to a higher side.

* * * * *